(12) United States Patent
Noh

(10) Patent No.: US 8,054,132 B2
(45) Date of Patent: Nov. 8, 2011

(54) OP-AMP CIRCUIT

(75) Inventor: Yu Jong Noh, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/647,628

(22) Filed: Dec. 28, 2009

(65) Prior Publication Data

US 2010/0194477 A1 Aug. 5, 2010

(30) Foreign Application Priority Data

Feb. 2, 2009 (KR) .................. 10-2009-0008068

(51) Int. Cl.
*H03F 3/45* (2006.01)
(52) U.S. Cl. ......................... 330/253; 330/261
(58) Field of Classification Search .................. 330/253, 330/261, 255, 257
See application file for complete search history.

(56) References Cited

U.S. PATENT DOCUMENTS

| | | | | |
|---|---|---|---|---|
| 5,220,288 A * | 6/1993 | Brooks | ........................... | 330/255 |
| 6,879,212 B2 * | 4/2005 | Suzuki | ........................... | 330/253 |

FOREIGN PATENT DOCUMENTS

| JP | 2004-020325 | 1/2004 |
|---|---|---|
| KR | 1020030037011 | 5/2003 |

OTHER PUBLICATIONS

Notice of Preliminary Rejection issued from Korean Intellectual Property Office on Aug. 26, 2010.
Notice of Preliminary Rejection issued from Korean Intellectual Property Office on Feb. 22, 2011.

* cited by examiner

*Primary Examiner* — Khanh Nguyen
(74) *Attorney, Agent, or Firm* — IP & T Group LLP

(57) ABSTRACT

An OP-amp circuit includes a first circuit unit configured to generate an operating voltage in response to an enable signal, a second circuit unit configured to amplify a difference between respective voltages received through an inverting terminal and a non-inverting terminal in response to the operating voltage and to output a result of the amplification as a first drive voltage, a third circuit unit configured to output a second drive voltage according to a voltage level of the first drive voltage inputted thereto, and a fourth circuit unit configured to divide an input voltage inputted thereto into a divided voltage according to two resistances having respective resistive values varying according to the first and second drive voltages and to output the divided voltage through an output terminal.

8 Claims, 2 Drawing Sheets

OP-AMP CIRCUIT

CROSS-REFERENCE TO RELATED APPLICATIONS

Priority to Korean patent application number 10-2009-0008068 filed on Feb. 2, 2009, the entire disclosure of which is incorporated by reference herein, is claimed.

BACKGROUND

Embodiments of the present invention relate to an OP-amp circuit and, more particularly, to an OP-amp circuit configured to stably amplify voltage.

A nonvolatile memory device has the advantages of both a random access memory (RAM), enabling the writing and erasure of data, and a read only memory (ROM), retaining its data even without the supply of power, and so it has recently been widely used as the storage media of electronic devices, such as digital cameras, personal digital assistants (PDAs), and MP3 players.

The nonvolatile memory device includes a memory cell array, a row decoder, a page buffer unit, etc. The memory cell array includes a plurality of word lines extending in rows, a plurality of bit lines extending in columns, and a plurality of memory cell strings corresponding to the respective bit lines.

The memory cells have varying threshold voltages according to their program states. It is ideal that the threshold voltages of the memory cells have the same threshold voltage according to the state of data to be stored. However, when an actual program operation is performed on memory cells, the threshold voltages of the memory cells have a probability distribution in each area because of, for example, the characteristic of a memory cell and various external environments such as coupling influence.

The nonvolatile memory device includes single level cells (SLCs) capable of storing 1-bit of information and multi level cells (MLCs) capable of storing 2 or more bits of information.

A distribution of the threshold voltages of SLCs or MLCs exists within a range of approximately 4.5 V or less. An amplification circuit formed of a PMOS transistor is used as the output driver of a regulator for generating verification operation voltages. The breakdown voltage of the PMOS transistor is about 5 V.

As the number of bit data, such as 3 bits or 4 bits, which will be stored in a memory device, is increased, a threshold voltage distribution of memory cells gradually rises. When voltages for read or verification operations are generated using such a high threshold voltage distribution, a voltage amplification circuit formed of a known PMOS transistor device cannot be used.

SUMMARY OF THE INVENTION

An embodiment of the present invention relates to an OP-amp circuit capable of amplifying voltage and stably supplying a high voltage.

An OP-amp circuit according to an embodiment of the present invention includes a first circuit unit configured to generate an operating voltage in response to an enable signal, a second circuit unit configured to amplify a difference between respective voltages received through an inverting terminal and a non-inverting terminal in response to the operating voltage and to output a result of the amplification as a first drive voltage, a third circuit unit configured to output a second drive voltage according to a voltage level of the first drive voltage, and a fourth circuit unit configured to divide an input voltage inputted thereto into a divided voltage according to two resistances having respective resistance values varying according to the first and second drive voltages and to output the divided voltage through an output terminal.

The third circuit unit includes at least one resistor, such as a poly resistor, coupled between the input voltage and a first node for outputting the second drive voltage, and a first transistor configured to couple the first node to a ground node in response to the first drive voltage.

The second drive voltage has a voltage level of the input voltage divided according to resistance values of the at least one resistor and the first transistor.

The fourth circuit unit further includes a second transistor coupled between an input terminal of the input voltage inputted thereto and the output terminal and driven in response to the second drive voltage, and a third transistor coupled between the output terminal and a ground node and driven in response to the first drive voltage inputted thereto.

The second and third transistors are N-type transistors.

The divided voltage outputted through the output terminal is a voltage which is divided according to a resistance value of the second transistor which varies according to the second drive voltage and a resistance value of the third transistor which varies according to the first drive voltage.

DESCRIPTION OF THE INVENTION

Figure 1A:
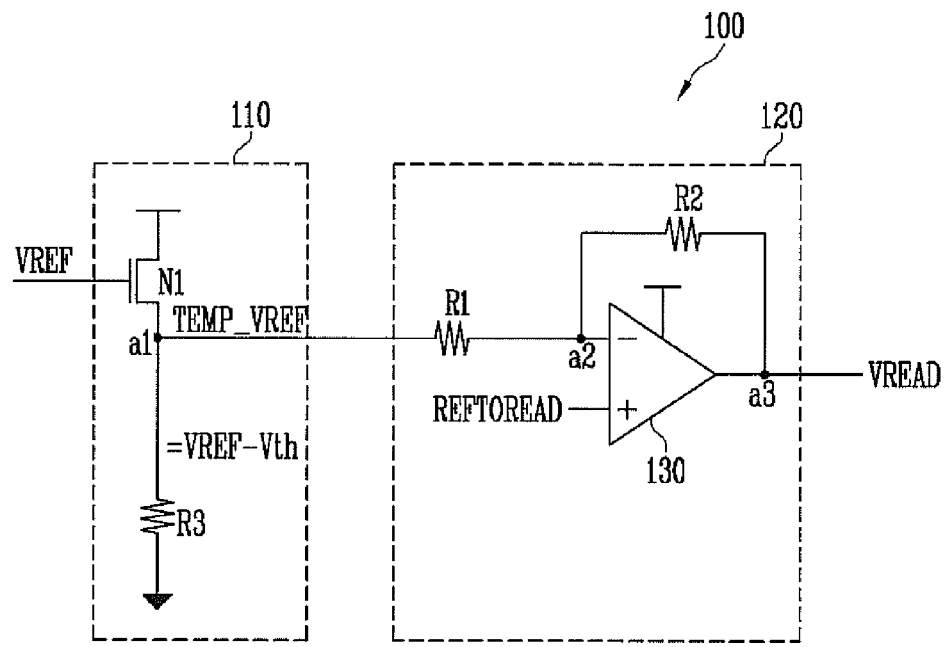
FIG. 1A shows a voltage amplification circuit.

An embodiment of the present invention is described in detail below with reference to the accompanying drawings. The drawing figures are provided to allow those having ordinary skill in the art to understand the scope of the embodiments of the present invention.

FIG. 1A shows a voltage amplification circuit.

The voltage amplification circuit 100 of FIG. 1A is configured to output a read voltage VREAD for a nonvolatile memory device.

Referring to FIG. 1A, the voltage amplification circuit 100 includes a reference voltage generation unit 110 and a voltage amplification unit 120.

The reference voltage generation unit 110 is configured to change a first reference voltage VREF according to a change in temperature and to output a result as a second reference voltage TEMP_REF. The voltage amplification unit 120 is configured to compare the second reference voltage TEMP_REF and a read reference voltage REFTOREAD, amplify a result of the comparison, and output a result of the amplification as the read voltage VREAD.

The first reference voltage VREF is supplied by a reference voltage generating circuit configured to generate a reference voltage using a backup voltage VBG of a nonvolatile memory device.

The reference voltage generation unit 110 includes a first NMOS transistor N1 and a third resistor R3. The voltage amplification unit 120 includes first and second resistors R1 and R2 and an OP-amp circuit 130.

The first NMOS transistor N1 is coupled between a power supply voltage and a node 'a1'. The first reference voltage VREF is inputted to the gate of the first NMOS transistor N1. The third resistor R3 is coupled between the node 'a1' and a ground node.

The voltage level of the node 'a1' becomes the second reference voltage TEMP_VREF which is changed according to temperature because the first NMOS transistor N1 has a different resistance level according to temperature.

The first resistor R1 is coupled between the node 'a1' and a node 'a2'. The node 'a2' is coupled to the inverting terminal (−) of the OP-amp circuit 130. The read reference voltage REFTOREAD is inputted to the non-inverting terminal (+) of the OP-amp circuit 130.

The second resistor R2 is coupled between the node 'a2' and a node 'a3'. The node 'a3' is coupled to the output terminal of the OP-amp circuit 130. The voltage outputted from the node 'a3' becomes the read voltage VREAD.

The OP-amp circuit 130 is configured to amplify the read reference voltage REFTOREAD according to the ratio of the respective resistances of the first and second resistors R1 and R2 and to output a result of the amplification as the read voltage VREAD.

A detailed circuit diagram of the OP-amp circuit 130 is described below.

Figure 1B:
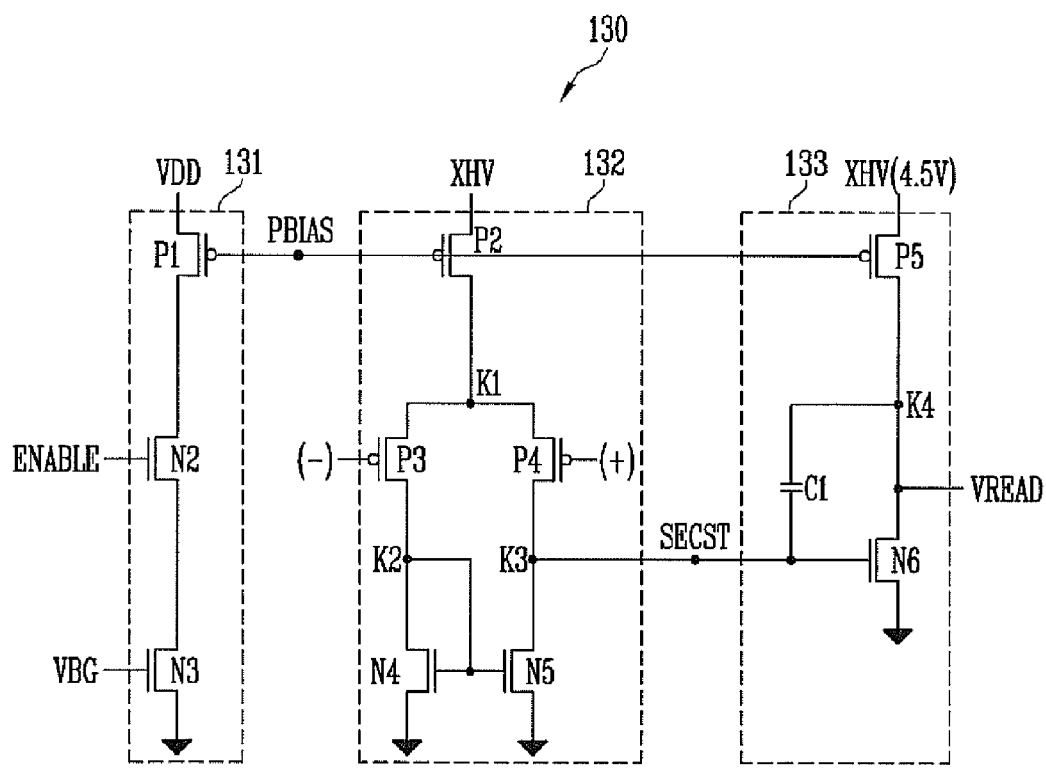
FIG. 1B a detailed circuit diagram of the OP-amp circuit shown in FIG. 1A.

FIG. 1B a detailed circuit diagram of the OP-amp circuit 130 shown in FIG. 1A.

Referring to FIG. 1B, the OP-amp circuit 130 includes first to third circuit units 131 to 133. The first circuit unit 131 is configured to enable the operation of the OP-amp circuit 130. The second circuit unit 132 is configured to output a drive voltage SECST according to a difference between voltages received through the inverting terminal (−) and the non-inverting terminal (+). The third circuit unit 133 is an output driver configured to stably output the read voltage VREAD according to the drive voltage SECST.

The first circuit unit 131 includes a first PMOS transistor P1 and second and third NMOS transistors N2 and N3. The second circuit unit 132 includes second to fourth PMOS transistors P2 to P4 and fourth and fifth NMOS transistors N4 and N5. The third circuit unit 133 includes a fifth PMOS transistor P5, a sixth NMOS transistor N6, and a first capacitor C1.

The first PMOS transistor P1 and the second and third NMOS transistors N2 and N3 are coupled in series between a power supply voltage VDD and a ground node.

A first voltage PBIAS outputted from the gate of the first PMOS transistor P1 is inputted to the second circuit unit 132. An enable signal ENABLE is inputted to the gate of the second NMOS transistor N2, and the backup voltage VBG is inputted to the gate of the third NMOS transistor N3.

The second PMOS transistor P2 is coupled between the input terminal of a second voltage XHV and a node K1. The first voltage PBIAS is inputted to the gate of the second PMOS transistor P2. The second voltage XHV has the highest level of the read voltage levels. In a nonvolatile memory device using SLCs or MLCs each capable of storing 2-bits of information, the second voltage XHV is about 4.5 V. As described above, the second PMOS transistor P2 is stably turned on in response to the first voltage PBIAS generated by the first circuit unit 131.

The third PMOS transistor P3 is coupled between the node K1 and a node K2. The fourth PMOS transistor P4 is coupled between the node K1 and a node K3. The gate of the third PMOS transistor P3 is coupled to the inverting terminal (−) of the OP-amp circuit 130, and the gate of the fourth PMOS transistor P4 is coupled to the non-inverting terminal (+) of the OP-amp circuit 130.

The fourth NMOS transistor N4 is coupled between the node K2 and a ground node, and the fifth NMOS transistor N5 is coupled between the node K3 and the ground node. The gate of the fourth NMOS transistor N4 and the gate of the fifth NMOS transistor N5 are in common coupled with the node K2.

The fifth PMOS transistor P5 is coupled between the input terminal of the second voltage XHV and a node K4. The first voltage PBIAS is inputted to the gate of the fifth PMOS transistor P5.

The sixth NMOS transistor N6 is coupled between the node K4 and the ground node. The gate of the sixth NMOS transistor N6 is coupled to the node K3. Furthermore, the first capacitor C1 is coupled between the node K4 and the node K3.

The third circuit unit 133 of the OP-amp circuit 130 is the output driver formed of a PMOS transistor P5 and can be supplied with only a low voltage XHV of 4.5 V or less.

In a nonvolatile memory device including MLCs each capable of storing 3 or more bits of information, the voltage level of the read voltage VREAD is more than 4.5 V. Accordingly, a voltage amplification circuit is configured using the following OP-amp circuit 200 according to an embodiment of the present invention.

Figure 2:
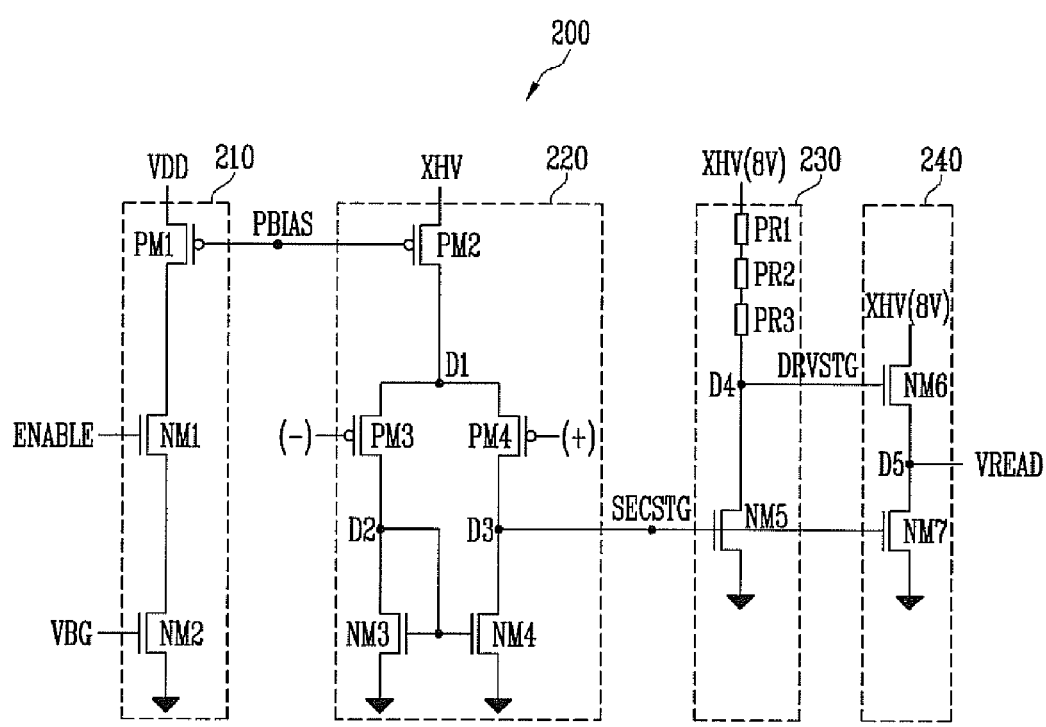
FIG. 2 is a circuit diagram of an OP-amp circuit according to an embodiment of the present invention.

FIG. 2 is a circuit diagram of an OP-amp circuit 200 according to an embodiment of the present invention.

Referring to FIG. 2, the OP-amp circuit 200 according to this embodiment of the present invention includes first to fourth circuit units 210 to 240.

The first circuit unit 210 is configured to enable the operation of the OP-amp circuit 200. The second circuit unit 220 is configured to output a first drive voltage SECSTG which is amplified according to a difference between respective voltages received through the inverting terminal (−) and the non-inverting terminal (+). The third circuit unit 230 is configured to supplement a current gain for preventing the amount of current, which is problematic according to an increase of an output voltage, from increasing and to output a second drive voltage DRVSTG. The fourth circuit unit 240 is configured to output a read voltage VREAD according to the first and second drive voltages SECSTG and DRVSTG supplied by the third circuit unit 230.

The first circuit unit 210 includes a first PMOS transistor PM1 and first and second NMOS transistors NM1 and NM2. The second circuit unit 220 includes second to fourth PMOS transistors PM2 to PM4 and third and fourth NMOS transistors NM3 and NM4.

The third circuit unit 230 includes first to third resistors PR1 to PR3 and a fifth NMOS transistor NM5. The fourth circuit unit 240 includes sixth and seventh NMOS transistors NM6 and NM7.

The first PMOS transistor PM1 and the first and second NMOS transistors NM1 and NM2 are coupled in series between a power supply voltage VDD and a ground node. When the first circuit unit 210 operates in response to an enable signal ENABLE, a first voltage PBIAS is outputted from the gate of the first PMOS transistor PM1. Thus, the second PMOS transistor PM2 can be stably turned on in response to the first voltage PBIAS.

An enable signal ENABLE is inputted to the gate of the first NMOS transistor NM1. A back voltage VBG is inputted to the gate of the second NMOS transistor NM2.

The second PMOS transistor PM2 is coupled between the input terminal of a high voltage XHV and a node D1. The first voltage PBIAS is inputted to the gate of the second PMOS transistor PM2.

The third PMOS transistor PM3 is coupled between the node D1 and a node D2. The fourth PMOS transistor PM4 is coupled between the node D1 and a node D3. The gate of the third PMOS transistor PM3 is coupled to the inverting terminal (−), and the gate of the fourth PMOS transistor PM4 is coupled to the non-inverting terminal (+).

The third NMOS transistor NM3 is coupled between the node D2 and the ground node, and the fourth NMOS transistor NM4 is coupled between the node D3 and the ground node. Furthermore, the gates of the third and fourth NMOS transistors NM3 and NM4 are in common coupled to the node D2.

The first drive voltage SECSTG is outputted from the node D3.

The first to third resistors PR1 to PR3 are coupled in series between the input terminal of the high voltage XHV and a node D4. The fifth NMOS transistor NM5 is coupled between the node D4 and the ground node. The first drive voltage SECSTG is inputted to the gate of the fifth NMOS transistor NM5. The second drive voltage DRVSTG is outputted from the node D4.

The sixth NMOS transistor NM6 is coupled between the input terminal of the high voltage XHV (8V) and a node D5. The seventh NMOS transistor NM7 is coupled between the node D5 and the ground node. The second drive voltage DRVSTG is inputted to the gate of the sixth NMOS transistor NM6, and the first drive voltage SECSTG is inputted to the gate of the seventh NMOS transistor NM7.

The high voltage XHV is 8 Volts or more. Furthermore, the first to third resistors PR1 to PR3 are configured to prevent a sharp increase in the amount of current when the second drive voltage DRVSTG to turn on the sixth NMOS transistor NM6 is generated. The resistors PR1 to PR3 can be formed of known resistors, such as poly resistors, and can solve a problem in an increase of the current in the third circuit unit 230.

The operation of the OP-amp circuit 200 is described below.

When the OP-amp circuit 200 operates in response to the enable signal ENABLE, the first voltage PBIAS turns on the second PMOS transistor PM2. Thus, the second circuit unit 220 amplifies a difference between voltages received through the inverting terminal (−) and the non-inverting terminal (+) and outputs the first drive voltage SECSTG. Here, the second circuit unit 220 is formed of a differential amplification circuit using PMOS transistors such that it is insensitive to noise resulting from external voltages and can stably generate voltages, including small voltage changes.

The third circuit unit 230 has a common source form and the fourth circuit unit 240 has a common drain or source follower such that stable voltages can be outputted. The sixth NMOS transistor NM6 is stable with respect to a relatively high voltage. Thus, in this embodiment of the present invention, the high voltage XHV of 8 V or more is inputted to the sixth NMOS transistor NM6, and the read voltage VREAD is outputted from the node D5.

Here, the voltage level of the second drive voltage DRVSTG is changed because a degree that the fifth NMOS transistor NM5 is turned on varies according to the first drive voltage SECSTG. Furthermore, a degree that the sixth NMOS transistor NM6 is turned on varies according to the second drive voltage DRVSTG. Accordingly, the voltage VREAD is controlled by the first drive voltage SECSTG. The first drive voltage SECSTG varies according to a difference between respective voltages inputted through the inverting terminal (−) and the non-inverting terminal (+) and plays the role of an OP-amp circuit.

As described above, the OP-amp circuit according to embodiments of the present invention includes transistors having a high breakdown voltage and resistors controlling the amount of current. Accordingly, a high voltage can be amplified and stably supplied.

What is claimed is:

1. An OP-amp circuit, comprising:
    a first circuit unit configured to generate an operating voltage in response to an enable signal;
    a second circuit unit configured to amplify a difference between voltages respectively received through an inverting terminal and a non-inverting terminal in response to the operating voltage and to output a result of the amplification as a first drive voltage; and
    a third circuit unit configured to output a second drive voltage according to a voltage level of the first drive voltage inputted thereto,
    wherein the third circuit unit comprises:
        at least one resistor coupled between an input voltage and a first node for outputting the second drive voltage; and
        a first transistor configured to couple the first node to a ground node in response to the first drive voltage.

2. The OP-amp circuit of claim 1, further comprising:
    a fourth circuit unit configured to divide the input voltage inputted thereto into a divided voltage according to two resistances and to output the divided voltage through an output terminal, wherein the two resistances have resistance values that vary according to the first and second drive voltages.

3. The OP-amp circuit of claim 1, wherein the second drive voltage has a voltage level of the input voltage divided according to resistance values of the at least one resistor and the first transistor.

4. The OP-amp circuit of claim 2, wherein the fourth circuit unit comprises:
    a second transistor coupled between an input terminal for inputting the input voltage and the output terminal, wherein the second transistor is driven in response to the second drive voltage inputted thereto; and
    a third transistor coupled between the output terminal and a ground node, wherein the third transistor is driven in response to the first drive voltage inputted thereto.

5. The OP-amp circuit of claim 4, wherein the second and third transistors are N-type transistors.

6. The OP-amp circuit of claim 5, wherein the divided voltage outputted through the output terminal is a voltage produced by performing a voltage division according to a resistance value of the second transistor and a resistance value of the third transistor, the resistance value of the second transistor varies according to the second drive voltage, and the resistance value of the third transistor varies according to the first drive voltage.

7. The OP-amp circuit of claim 1, wherein the first and second circuit units are connected to ground and the first circuit unit is configured to receive a different power supply voltage than a supply power voltage applied to the second circuit unit.

8. The OP-amp circuit of claim 4, wherein the third circuit unit is connected to a voltage that is a power supply voltage of third circuit unit.

* * * * *